(12) United States Patent
Ogawa

(10) Patent No.: US 12,298,797 B2
(45) Date of Patent: May 13, 2025

(54) SIGNAL TRANSMISSION DEVICE

(71) Applicants: Kabushiki Kaisha Toshiba, Tokyo (JP); Toshiba Electronic Devices & Storage Corporation, Tokyo (JP)

(72) Inventor: Tatsuhiro Ogawa, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 18/119,709

(22) Filed: Mar. 9, 2023

(65) Prior Publication Data

US 2024/0094755 A1 Mar. 21, 2024

(30) Foreign Application Priority Data

Sep. 20, 2022 (JP) ................. 2022-149298

(51) Int. Cl.
| | | |
|---|---|---|
| *H03K 17/04* | (2006.01) | |
| *G05F 1/607* | (2006.01) | |
| *H03K 17/687* | (2006.01) | |
| *H03K 19/01* | (2006.01) | |
| *H04B 1/04* | (2006.01) | |

(52) U.S. Cl.
CPC .......... *G05F 1/607* (2013.01); *H03K 17/6872* (2013.01); *H03K 19/01* (2013.01); *H04B 1/04* (2013.01)

(58) Field of Classification Search
CPC ............... H03K 17/04; H03K 17/041; H03K 17/04106; H03K 17/063; H03K 17/08; H03K 17/081; H03K 17/08104; H03K 17/687; H03K 17/6872; H03K 17/6874; H03K 19/003; H03K 19/00315; H03K 19/01; H03K 19/017; H03K 19/0008; H03K 19/0013; H04B 1/04; H04B 1/16
See application file for complete search history.

(56) References Cited

U.S. PATENT DOCUMENTS

| | | | | |
|---|---|---|---|---|
| 5,606,268 A | * | 2/1997 | Van Brunt | ....... H03K 19/00384 326/73 |
| 7,256,624 B2 | * | 8/2007 | Cheng | ................. H04L 25/0272 327/112 |
| 7,688,140 B2 | | 3/2010 | Yuasa | |

FOREIGN PATENT DOCUMENTS

| | | |
|---|---|---|
| JP | 2004-112453 A | 4/2004 |
| JP | 2008-092106 A | 4/2008 |
| JP | 2010-206458 A | 9/2010 |

* cited by examiner

*Primary Examiner* — Long Nguyen
(74) *Attorney, Agent, or Firm* — Kim & Stewart LLP

(57) ABSTRACT

A transmission buffer of a signal transmission device according to the embodiment includes: a differential circuit portion that is connected between the first potential and the second potential; a variable current source portion that supplies current to the differential circuit portion; a switch port that switches between a conductive state and a disconnected state between the first transmission terminal and the fixed potential and between the second transmission terminal and the fixed potential; and a controller that controls the current supplied by the variable current source portion to the differential circuit portion, and that controls the operation of the switch portion.

10 Claims, 7 Drawing Sheets

SIGNAL TRANSMISSION DEVICE

CROSS-REFERENCE TO RELATED APPLICATIONS

This application is based upon and claims the benefit of priority from the prior Japanese Patent Application No. 2022-149298, filed on Sep. 20, 2022 the entire contents of which are incorporated herein by reference.

FIELD

This embodiment relates to a signal transmission device.

BACKGROUND

For example, a signal transmission device, which is an interface circuit that communicates between chips, is preferably an LVDS (Low-Voltage Differential Signaling) circuit that can reduce the voltage amplitude between chips from the viewpoint of reducing current consumption and radiation noise.

As such an LVDS signal transmission device, there is one that applies a transmission method that combines a differential signal and an in-phase signal.

Then, for example, in the case of a format in which in-phase and differential are alternately transmitted for each clock, the propagation delay of differential transmission and the transition time between in-phase and differential transmission must be equal.

That is, in the LVDS system signal transmission device, it is necessary to increase the speed of switching between in-phase transmission and differential transmission.

DETAILED DESCRIPTION

An object of one embodiment is to provide a signal transmission device capable of increasing the speed of switching between in-phase transmission and differential transmission.

A signal transmission device, according to an embodiment, having a transmission buffer and a reception buffer, wherein the transmission buffer comprises:
a differential circuit portion that is connected between the first potential and the second potential, and that outputs the first transmission signal to the first transmission terminal and the second transmission signal to the second transmission terminal, depending on the first input signal input via the first input terminal and the second input signal input via the second input terminal;
a variable current source portion that supplies current to the differential circuit portion;
a switch port that switches between a conductive state and a disconnected state between the first transmission terminal and the fixed potential and between the second transmission terminal and the fixed potential; and
a controller that controls the current supplied by the variable current source portion to the differential circuit portion, and that controls the operation of the switch portion, and
wherein the reception buffer comprises:
a first differential pair of the first conductivity type that is connected between the third potential and the fourth potential, that outputs a first reception current in response to the first transmission signal input via the first reception terminal, and that outputs a second reception current in response to the second transmission signal input via the second reception terminal;
a second differential pair of the second conductivity type that is connected between the third potential and the fourth potential, that outputs a third received current in response to the first transmission signal, and that outputs a fourth received current in response to the second transmission signal;
a first current mirror portion that flows a current obtained by current mirroring the first received current between the third potential and the second output terminal, and that flows a current obtained by current mirroring the second received current between the third potential and the first output terminal; and
a second current mirror portion that flows a current obtained by current mirroring the third received current between the second output terminal and the fourth potential, and that flows a current obtained by current mirroring the fourth received current between the first output terminal and the fourth potential.

The signal transmission device according to the embodiment will be described in detail below with reference to the accompanying drawings. In addition, the present invention is not limited by these embodiments.

First Embodiment

[Signal Transmission Device]

Figure 1:
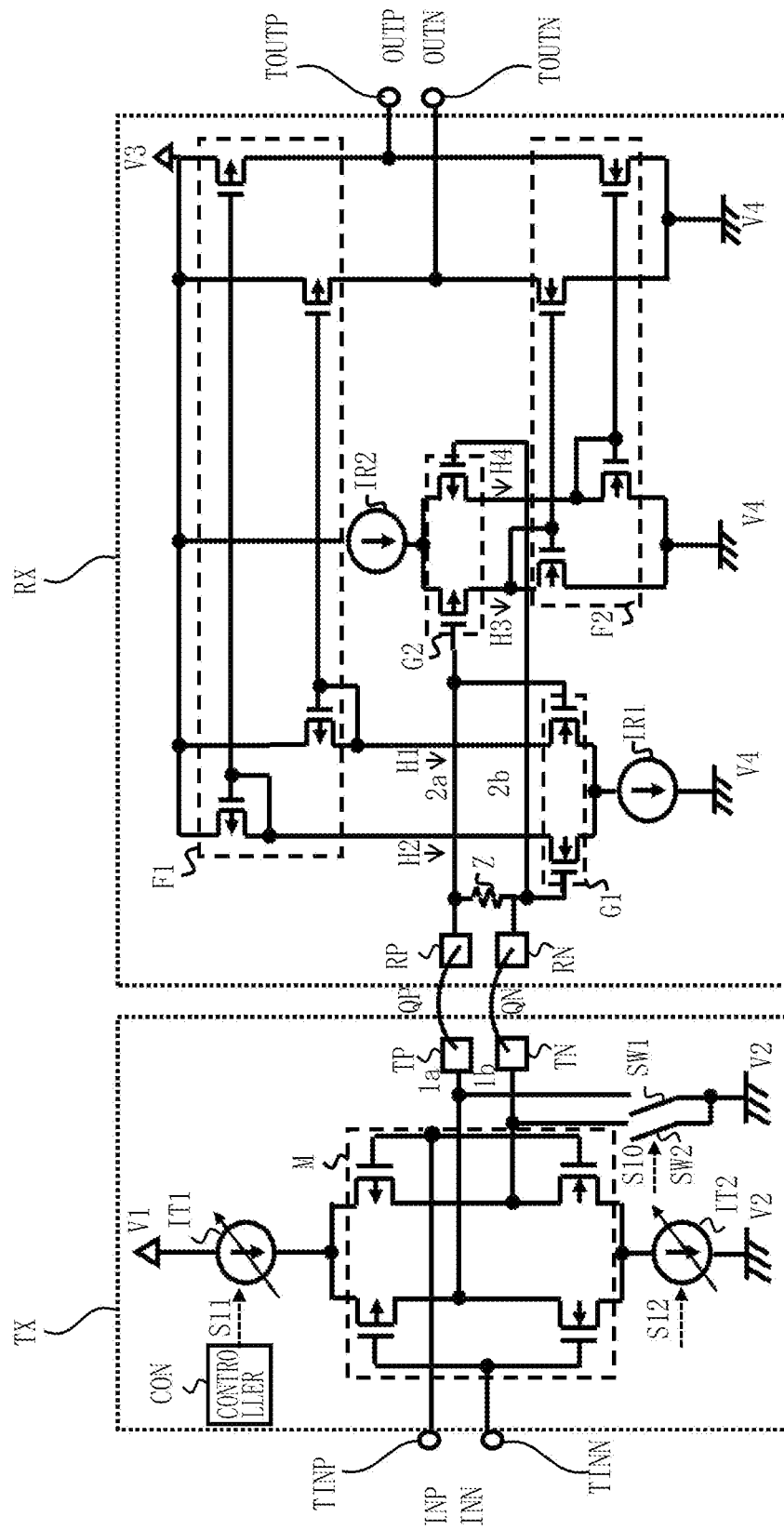
FIG. 1 is a diagram showing an example of the configuration of a signal transmission device according to the first embodiment.

FIG. 1 is a diagram showing an example of the configuration of a signal transmission device according to the first embodiment.

The signal transmission device 100 according to the first embodiment is an LVDS (Low-Voltage Differential Signaling) signal transmission device.

For example, as shown in FIG. 1, the signal transmission device 100 according to the first embodiment includes a transmission buffer TX and a reception buffer RX.

The transmission buffer TX and the reception buffer RX are connected by a first wiring (wire) QP and a second wiring (wire) QN.

[Transmission Buffer]

The transmission buffer TX is adapted to output the first transmission signal 1a and the second transmission signal 1b, according to the first input signal INP input via the first input terminal TINP and the second input signal INN input via the second input terminal TINN. This transmission buffer circuit TX is an LVDS circuit.

For example, as shown in FIG. 1, the transmission buffer TX includes a differential circuit portion M, variable current source portions IT1 and IT2, switch portions SW1 and SW2, and a controller CON.

The differential circuit portion M is connected between a first potential (for example, the power supply potential of the transmission buffer TX) V1 and a second potential (for example, the ground potential of the transmission buffer TX) V2.

The differential circuit portion M outputs the first transmission signal 1a to the first transmission terminal TP and outputs the second transmission signal 1b to the second transmission terminal TN, according to the first input signal INP input via the first input terminal TINP and the second input signal INN input via the second input terminal TINN.

Also, the variable current sources IT1 and IT2 are connected between the first potential V1 and the second potential V2.

The variable current source portions IT1 and IT2 supply currents to the differential circuit portion M, and the values of the currents can be changed.

In addition, the switches SW1 and SW2 switch between the conductive state and the disconnected state between the first transmission terminal TP and the fixed potential and between the second transmission terminal TN and the fixed potential.

Note that the fixed potential is the second potential (for example, the ground potential of the transmission buffer TX) V2 in the example shown in FIG. 1. The fixed potential may be the first potential (for example, the power supply potential of the transmission buffer TX) V1, as will be described later.

In addition, the controller CON controls the current supplied from the variable current source portions IT1 and IT2 to the differential circuit portion M, and also controls the operations of the switch portions SW1 and SW2.

Here, for example, when the first input signal INP and the second input signal INN are in-phase (common mode) signals (for example, LL signal: "Low" level common-mode signal), the controller CON turns on the switches SW1 and SW2, so that the first transmission terminal TP and the fixed potential (here, the second potential V2) and the second transmission terminal TN and the fixed potential are electrically connected.

Accordingly, when the first input signal INP and the second input signal INN are in-phase signals (for example, LL signal), the common mode voltage can be rapidly lowered.

On the other hand, when the first input signal INP and the second input signal INN are differential signals, the controller CON controls the switches SW1 and SW2 to be off. so that between the first transmission terminal TP and the fixed potential, and between the second transmission terminal TN and the fixed potential are cut off.

Furthermore, when the first input signal INP and the second input signal INN are in-phase signals, the controller CON controls the variable current source portion IT so that the current supplied to the differential circuit portion M increases.

On the other hand, the controller CON controls the variable current source section IT so that the current supplied to the differential circuit section M decreases, when the first input signal INP and the second input signal INN are differential signals.

Accordingly, when the first input signal INP and the second input signal INN are differential signals, the common mode voltage can be rapidly raised.

For example, as shown in FIG. 1, a first wiring (wire) QP is connected between the first transmitting terminal TP and the first receiving terminal RP, a first transmission signal output from the transmission buffer TX is transmitted to the reception buffer RX via the first wiring QP. Furthermore, for example, as shown in FIG. 1, a second wiring (wire) QN is connected between the second transmission terminal TN and the second reception terminal RN, a second transmission signal output from the transmission buffer TX is transmitted to the reception buffer RX via the second wiring QN.

[Receive Buffer]

Also, the reception buffer RX outputs the first output signal OUTP to the first output terminal TOUTP and outputs the second output signal OUTN to the second output terminal TOUTN, according to the first transmission signal 1a and the second transmission signal 1b. This receiving circuit RX is an LVDS circuit.

For example, as shown in FIG. 1, the reception buffer RX includes a first conductive type first differential pair (nMOS differential pair) G1, a second conductive type second differential pair (pMOS differential pair) G2, an input resistor Z, a first current mirror portion F1, a second current mirror portion F2, a first constant current source IR1, and a second constant current source IR2.

A first differential pair (nMOS differential pair) G1 is connected between a third potential (for example, the power supply potential of the reception buffer RX) V3 and a fourth potential (for example, the ground potential of the reception buffer RX) V4. The first differential pair G1 outputs a first reception current H1 in response to the first transmission signal 2a input via the first reception terminal RP, and outputs a second reception current H2 in response to a second transmission signal 2b input via a second reception terminal RN.

The first constant current source IR1 is connected between the fourth potential V4 and the first differential pair G1, and is adapted to supply current to this first differential pair G1.

The input resistor Z is connected between the first receiving terminal RP and the second receiving terminal RN.

Also, the second differential pair (pMOS differential pair) G2 is connected between the third potential V3 and the fourth potential V4. The second differential pair G2 outputs the third received current H3 in response to the first transmission signal 2a, and outputs the fourth received current H4 in response to the second transmission signal 2b.

The second constant current source IR2 is connected between the third potential V3 and the second differential pair G2, and is adapted to supply current to this second differential pair G2.

In addition, the first current mirror portion F1 flows a current, obtained by current mirroring the first received current H1, between the third potential V3 and the second output terminal TOUTN, and the first current mirror portion F1 is configured to flow a current, obtained by current mirroring the second reception current H2, between the third potential V3 and the first output terminal TOUTP.

In addition, the second current mirror portion F2 flows a current, obtained by mirroring the third received current H3, between the second output terminal TOUTN and the fourth potential V4, and the second current mirror portion F2 is adapted to flow a current, obtained by current mirroring the fourth reception current H4, between the first output terminal TOUTP and the fourth potential V4.

Here, for example, when the first transmission signal 2a and the second transmission signal 2b input to the reception buffer RX are in-phase signals (here, LL signals), the first differential pair G1 is turned off (the two nMOS transistors are turned off) to stop outputting the first and second reception currents H1 and H2, and the second differential pair G2 is turned on (two pMOS transistors are turned on) to output the third and fourth reception currents H3 and H4.

As a result, when the first transmission signal 2a and the second transmission signal 2b input to the reception buffer RX are in-phase signals (here, LL signals), the first current mirror portion F1 does not flow a current between the third potential V3 and the first and second output terminals TOUTP and TOUTN, and the second current mirror portion F2 causes current to flow between the fourth potential V4 and the first and second output terminals TOUTP and TOUTN. That is, when the first transmission signal and the second transmission signal are in-phase signals (here, LL signals), the first and second output signals OUTP and OUTN (in-phase signals (LL signals)) of "Low" level are output from the first and second output terminals TOUTP and TOUTN.

Therefore, when the first input signal INP and the second input signal INN are in-phase signals, the signal transmission device 100 outputs first and second output signals OUTP and OUTN which are in-phase signals.

On the other hand, when the first transmission signal and the second transmission signal input to the reception buffer RX are differential signals, depending on the first transmission signal and the second transmission signal, the first differential pair G1 outputs first and second reception currents H1 and H2, and the second differential pair G2 outputs third and fourth reception currents.

As a result, when the first transmission signal and the second transmission signal input to the reception buffer RX are differential signals, the First and second output signals OUTP and OUTN, which are differential signals, are output. Therefore, when the first input signal INP and the second input signal INN are differential signals, the first and second output signals OUTP and OUTN, which are differential signals, are output.

Thus, the signal transmission device 100, which is an LVDS circuit, includes the transmission buffer TX that outputs a fixed signal of a predetermined potential corresponding to the input signal when the input signal is an in-phase signal, and the receiving buffer RX that outputs an in-phase signal corresponding to the transmission signal when the transmission signal input from the transmission buffer TX is an in-phase signal.

Here, more detailed configurations of the signal transmission device 100 according to the first embodiment and an example of its operation will be described with reference to the following specific examples.

Figure 2:
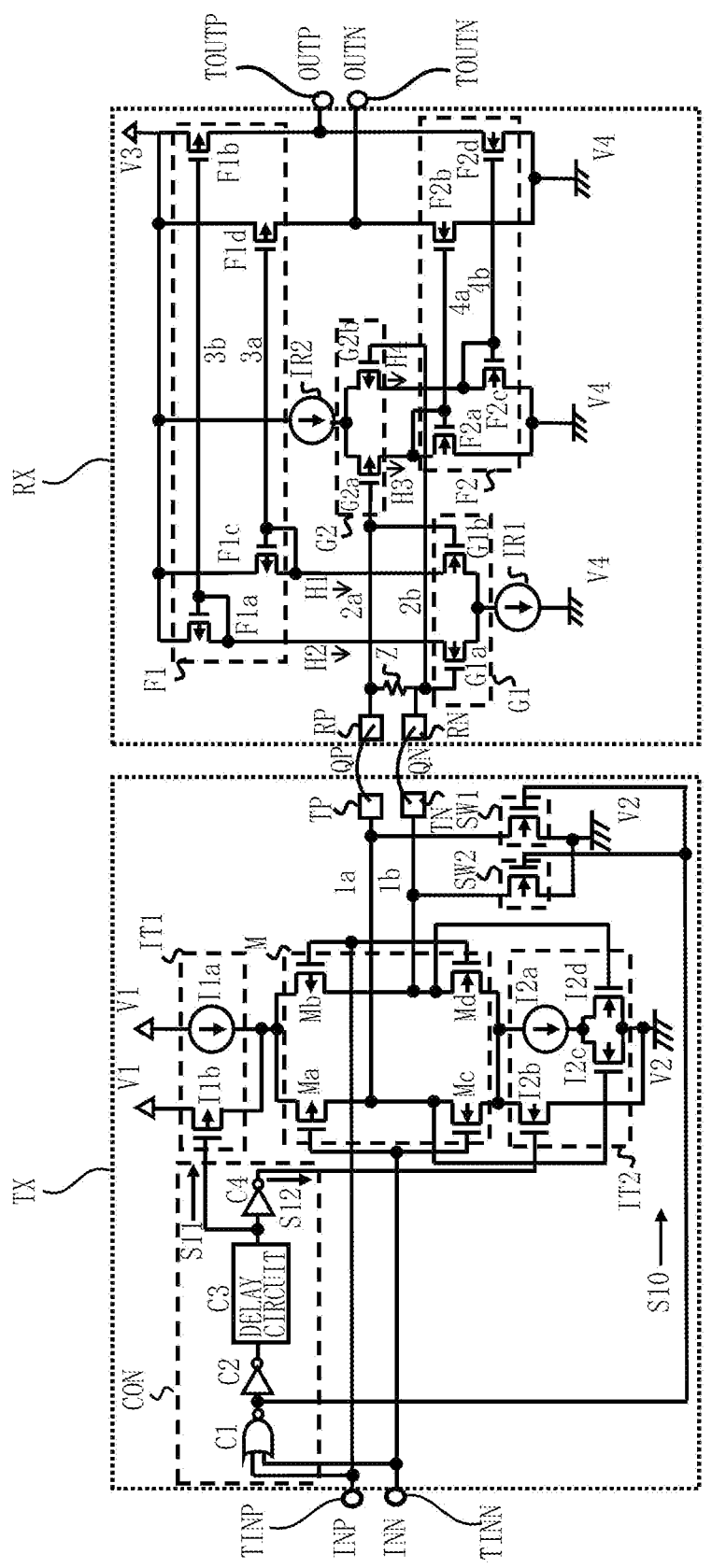
FIG. 2 is a diagram illustrating an example of the configuration of the signal transmission device according to the embodiment.
Figure 3:
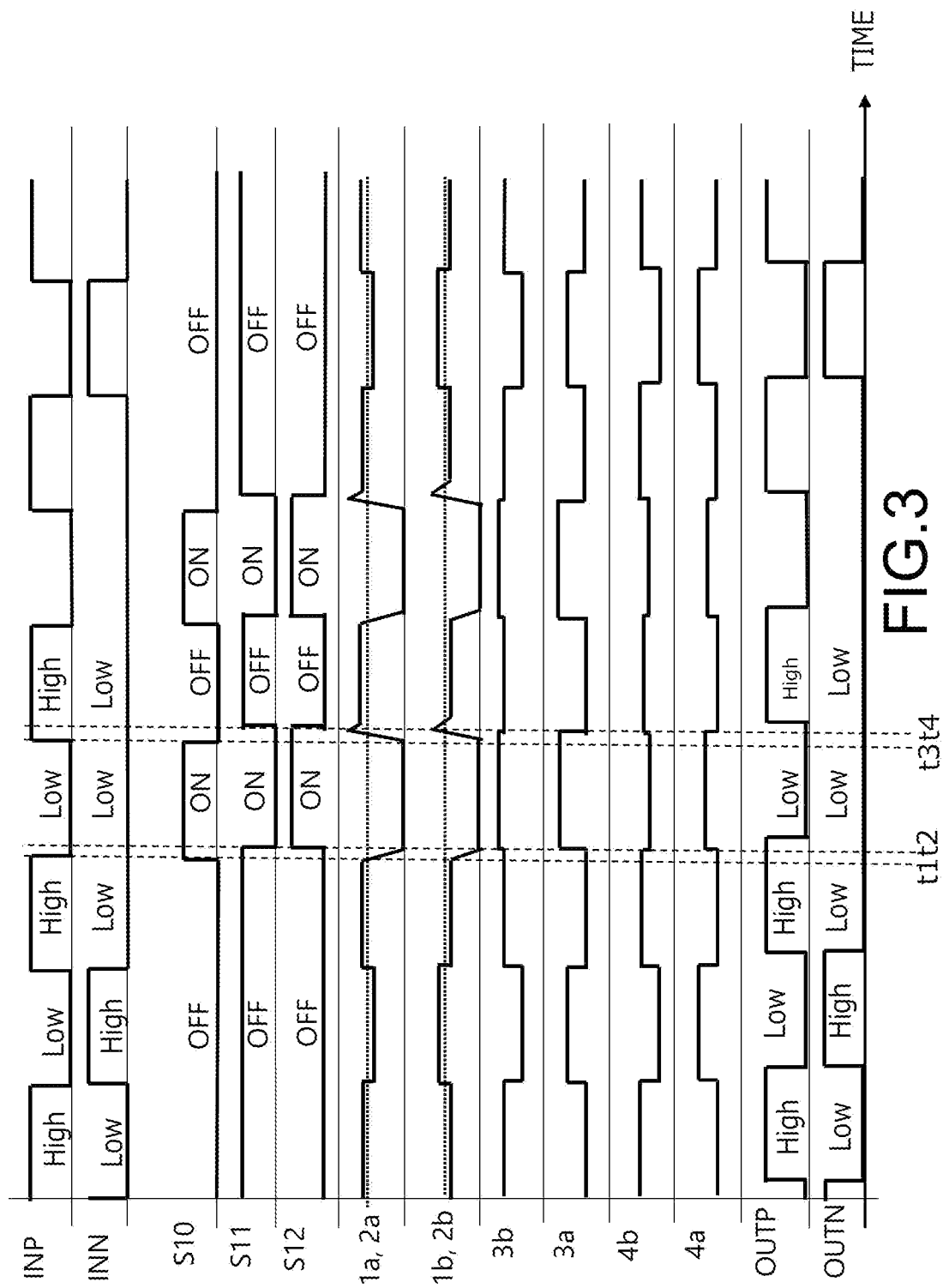
FIG. 3 is a waveform diagram for explaining an example of the operation of the signal transmission device shown in FIG. 2.

FIG. 2 is a diagram showing an example of the configuration of the signal transmission device according to the embodiment. Also, FIG. 3 is a waveform diagram for explaining an example of the operation of the signal transmission device shown in FIG. 2. In the following description, among the constituent elements shown in FIG. 2, the constituent elements that are the same as the constituent elements shown in FIG. 1 are denoted by the same reference numerals as those shown in FIG. 1, and the explanation thereof may be omitted. Each circuit configuration of the signal transmission device 100 according to the embodiment shown in FIG. 2 is an example, and may be replaced by a configuration capable of executing similar functions.

[Transmission Buffer]

As described in the first embodiment, the transmission buffer TX is adapted to output a first transmission signal 1a and a second transmission signal 1b, according to the first input signal INP input via the first input terminal TINP and the second input signal INN input via the second input terminal TINN. This transmission buffer circuit TX is an LVDS circuit.

For example, as shown in FIG. 2, the transmission buffer TX includes a differential circuit portion M, variable current source portions IT1 and IT2, a switch portion SW, and a controller CON.

[Differential Circuit Portion]

As described above, the differential circuit section M is connected between the first potential V1 and the second potential V2, the differential circuit section M outputs the first transmission signal 1a to the first transmission terminal TP and outputs the second transmission signal 1b to the second transmission terminal TN, according to the first input signal INP input via the first input terminal TINP and the second input signal INN input via the second input terminal TINN.

For example, as shown in FIG. 2, this differential circuit portion M includes pMOS transistors (first conductivity type MOS transistors) Ma and Mb, and nMOS transistors (second conductivity type MOS transistors) Mc and Md.

The pMOS transistor Ma has a gate connected to the second input terminal INN, a source connected to the first variable current source IT1, and a drain connected to the first transmission terminal TP. The pMOS transistor Mb has a gate connected to the first input terminal INP, a source connected to the first variable current source IT1, and a drain connected to the second transmission terminal TN.

The nMOS transistor Mc has a gate connected to the second input terminal INN, a source connected to the second variable current source IT2, and a drain connected to the first transmission terminal TP. The nMOS transistor Md has a gate connected to the first input terminal INP, a source connected to the second variable current source IT2, and a drain connected to the second transmission terminal TN.

[Variable Current Source]

For example, as shown in FIG. 2, the variable current source portions IT1 and IT2 include a first variable current source IT1 and a second variable current source IT2.

The first variable current source IT1 is connected between the first potential V1 and the differential circuit portion M to supply current to the differential circuit portion M.

More specifically, for example, as shown in FIG. 2, the first variable current source IT1 includes a constant current source I1a and a pMOS transistor I1b.

The constant current source I1a is connected between the first potential V1 and the differential circuit portion M (the sources of the pMOS transistors Ma and Mb). This constant current source I1a supplies a preset constant current to the differential circuit portion M. The constant current source I1a is, for example, connected between the first potential V1 and the differential circuit portion M, and is configured using a MOS transistor having a gate to which a preset voltage is applied, and may be configured as a current mirror circuit.

The pMOS transistor I1b has a gate connected to the controller CON, a source connected to the first potential V1, and a drain connected to the differential circuit M (the sources of the pMOS transistors Ma and Mb). This pMOS transistor I1b is controlled to be on/off by a control signal S11 output from the controller CON.

Here, the controller CON adjusts the conduction state of this pMOS transistor I1*b* according to the first and second input signals INP and INN, the current output from the first variable current source IT1, which constitutes the variable current source portions IT1 and IT2, changes. It is noted that the controller CON adjusts the conduction state of this pMOS transistor I1*b* according to an external signal, the current output from the first variable current source IT1 constituting the variable current source portions IT1 and IT2 may be varied.

Also, the second variable current source IT2 is connected between the second potential V2 and the differential circuit portion M to supply current to the differential circuit portion M.

Furthermore, for example, as shown in FIG. 2, the second variable current source IT2 includes a constant current source I2*a* and nMOS transistors I2*b*, I2*c* and I2*d*.

The constant current source I2*a* is connected between the second potential V2 and the differential circuit M (the sources of the nMOS transistors Mc and Md). This constant current source I2*a* supplies a preset constant current to the differential circuit M. It is noted that the constant current source I2*a* may be configured as a current mirror circuit using, for example, the MOS transistor connected between the second potential V2 and the differential circuit portion M and having a gate to which a preset voltage is applied.

The nMOS transistor I2*b* has a gate connected to the controller CON, a source connected to the second potential V2, and a drain connected to the differential circuit M (nMOS transistors Mc, Mc sources). This nMOS transistor I2*b* is controlled to be on/off by a control signal S12 output from the controller CON.

Here, the controller CON adjusts the conduction state of this nMOS transistor I2*b* according to the first and second input signals INP, INN (or an external signal not shown), the current output from the second variable current source IT2, which constitutes the variable current source portions IT1 and IT2, changes.

Also, the nMOS transistor I2*c* is connected between the constant current source I2*a* and the second potential V2, the nMOS transistor I2*c* has a gate connected to the first transmission terminal TP (the sources of the pMOS transistor Ma and the nMOS transistor Mc). Also, the nMOS transistor I2*d* is connected between the constant current source I2*a* and the second potential V2, the nMOS transistor I2*d* has a gate connected to the second transmission terminal TN (the drains of the pMOS transistor Mb and the nMOS transistor Md). These nMOS transistors I2*c* and I2*d* control charge/discharge of the common mode voltage at the first and second transmission terminals TP and TN. The nMOS transistor may be feedback-controlled by a differential amplifier based on the voltage obtained by dividing the output voltage of the differential circuit M.

[Switch Portion]

As described above, for example, as shown in FIG. 2, the switch portions SW1 and SW2 include a first switch SW1 and a second switch SW2.

The first switch SW1 is connected between the first transmission terminal TP and the second potential V2. This first switch SW1 is turned on/off controlled by a control signal S10 output by the controller CON. For example, as shown in FIG. 2, the first switch SW1 is configured by a MOS transistor connected between the first transmission terminal TP and the second potential V2 and having a gate to which the control signal S10 is input.

Also, the second switch SW2 is connected between the second transmission terminal TN and the second potential V2. This second switch SW2 is turned on/off controlled by a control signal S10 output from the controller CON. For example, as shown in FIG. 2, the second switch SW2 is configured by a MOS transistor connected between the second transmission terminal TN and the second potential V2 and having a gate to which the control signal S10 is input.

[Controller]

As mentioned above, the controller CON controls the current supplied to the differential circuit portion M by the variable current source portions IT1 and IT2 (first and second variable current sources IT1 and IT2), and controls the operation of the switch portions SW1 and SW2 (first and second switches SW1 and SW2).

For example, as shown in FIG. 2, this controller CON includes a NOR circuit C1, a first inverter C2, a delay circuit C3, and a second inverter C4.

Then, the NOR circuit C1 receives the first input signal INP and the second input signal INN, and outputs a signal (switch control signal S10) obtained by operating the first input signal INP and the second input signal INN.

Also, the first inverter C2 receives the signal (switch control signal S10) output from the NOR circuit C1 and outputs a signal obtained by inverting the signal (switch control signal S10).

The delay circuit C3 receives the signal output from the first inverter C2 and outputs a signal (first current control signal S11) obtained by delaying the signal by a preset delay time.

Also, the second inverter C4 receives the signal (first current control signal S11) output by the delay circuit C3, and outputs a signal (second current control signal S12) obtained by inverting the signal (first current control signal S11).

Here, for example, the controller CON turns off the first switch SW1 and the second switch SW2 by the control signal S10, when the first input signal INP and the second input signal INN are differential signals.

On the other hand, the controller CON turns on the first switch SW1 and the second switch SW2 by the control signal S10 when the first input signal INP and the second input signal INN are in-phase signals.

In addition, when the first input signal INP and the second input signal INN are in-phase signals, the controller CON controls the switch portion SW to turn on, in order to establish a conductive state between the first transmission terminal TP and the fixed potential (here, the second potential V2) and between the second transmission terminal TN and the fixed potential, then the controller CON controls the variable current source portions IT1 and IT2 so that the current supplied to the differential circuit portion M increases after a preset delay time has elapsed.

On the other hand, when the first input signal INP and the second input signal INN are differential signals, the controller CON turns off the switches SW1 and SW2, so that the first transmission terminal TP and the fixed potential (second potential V2) and the second transmission terminal TN and the fixed potential are cut off, after that, the controller CON controls the variable current source portions IT1 and IT2 so that the current supplied to the differential circuit portion M decreases after the delay time has elapsed.

Thus, in the example shown in FIG. 2, the controller CON controls the operations of the first and second variable current sources IT1 and IT2, the first switch SW1 and the second switch SW2, based on the inputs of the first input signal INP and the second input signal INN However, it is not limited to this, the controller CON may control the operations of the first and second variable current sources IT1 and IT2, the first switch SW1 and the second switch SW2, based on the input of an external signal (not shown). In this case, for example, the circuit configuration omits the NOR circuit C1 of the controller CON, the delay circuit C3 outputs the first current control signal S11 for controlling the first variable current source portion IT1, and the second inverter C4 outputs the second current control signal S12 for controlling the second variable current source portion IT2, by inputting the external signal to the first inverter C2. Furthermore, in this case, the controller CON may output the external signal as a switch control signal S10 for controlling the first and second switches SW1 and SW2.

[Reception Buffer]

As described in the first embodiment, the reception buffer RX outputs the first output signal OUTP to the first output terminal TOUTP and outputs the second output signal OUTN to the second output terminal TOUTN in response to the first transmission signal 1a and the second transmission signal 1b. This receiving circuit RX is an LVDS circuit.

For example, as shown in FIG. 1, this reception buffer RX includes a first differential pair (nMOS differential pair) G1, which is of the first conductivity type; a second differential pair (pMOS differential pair) G2, which is of the second conductivity type; an input resistance Z; a first current mirror portion F1; a first constant current source IR1, and a second constant current source IR2.

[First Differential Pair]

As described above, the first differential pair (nMOS differential pair) G1 is connected between the third potential (for example, power supply potential of reception buffer RX) V3 and the fourth potential (for example, ground potential of reception buffer RX) V4. The first differential pair G1 outputs a first reception current H1 in response to the first transmission signal 2a input via the first reception terminal RP, and outputs the second reception current H2 in response to the second transmission signal 2b inputted via the second reception terminal RN.

For example, as shown in FIG. 2, this first differential pair G1 includes nMOS transistors G1a and G1b.

The nMOS transistor G1a has a source connected to the first constant current source IR1, a gate connected to the second reception terminal RN, and a drain connected to the first current mirror portion F1 (the drain of the pMOS transistor F1a).

The nMOS transistor G1b has a source connected to the first constant current source IR1, a gate connected to the first receiving terminal RP, and a drain connected to the first current mirror portion F1 (the drain of the pMOS transistor F1c).

[Second Differential Pair]

As described above, the second differential pair (pMOS differential pair) G2 is connected between the third potential V3 and the fourth potential V4. The second differential pair G2 outputs the third received current H3 in response to the first transmission signal 2a, and outputs the fourth received current H4 in response to the second transmission signal 2b.

For example, as shown in FIG. 2, this second differential pair G2 includes pMOS transistors G2a and G2b.

The pMOS transistor G2a has a source connected via the second constant current source IR2, a gate connected to the first receiving terminal RP, and a drain connected to the second current mirror portion F2 (the drain of the nMOS transistor F2a).

The pMOS transistor G2b has a source connected to the second constant current source IR2, a gate connected to the second reception terminal RN, and a drain connected to the second current mirror portion F2 (the drain of the nMOS transistor F2c).

[First Current Mirror Portion]

As described above, the first current mirror portion F1 flows a current, obtained by current mirroring the first reception current H1 output by the first differential pair G1, between the third potential V3 and the second output terminal TOUTN, and flows a current, obtained by current mirroring the second reception current H2 output from the first differential pair G1, between the third potential V3 and the first output terminal TOUTP.

For example, as shown in FIG. 2, this first current mirror portion F1 includes pMOS transistors F1a, F1b, F1c, and F1d.

The pMOS transistor F1a has a source connected to the third potential V3, and a gate and drain connected to the first differential pair G1 (the drain of the nMOS transistor G1a).

The pMOS transistor F1b has a source connected to the third potential V3, a drain connected to the first output terminal TOUTP, and a gate connected to the gate of the pMOS transistor F1a and the first differential pair G1 (the drain of the nMOS transistor G1a).

These pMOS transistors F1a and F1b constitute a current mirror circuit that flows a current, obtained by mirroring the second reception current H2 output from the first differential pair G1, between the third potential V3 and the first output terminal TOUTP.

The pMOS transistor F1c has a source connected to the third potential V3, and a gate and drain connected to the first differential pair G1 (the drain of the nMOS transistor G1b).

The pMOS transistor F1d has a source connected to the third potential V3, a drain connected to the second output terminal TOUTN, and a gate connected to the gate of the pMOS transistor F1c and the first differential pair G1 (the drain of the nMOS transistor G1b).

These pMOS transistors F1c and F1d form a current mirror circuit that flows a current, obtained by mirroring the first reception current H1 output from the first differential pair G1, between the third potential V3 and the second output terminal TOUTN.

[Second Current Mirror Portion]

As described above, the second current mirror portion F2 flows a current, obtained by current mirroring the third reception current H3 output from the second differential pair G2, between the second output terminal TOUN and the fourth potential V4, and flows a current, obtained by current mirroring the fourth received current H4, between the first output terminal TOUTP and the fourth potential V4.

For example, as shown in FIG. 2, this second current mirror portion F2 includes nMOS transistors F2a, F2b, F2c, and F2d.

The nMOS transistor F2a has a source connected to the fourth potential V4 and a gate and drain connected to the second differential pair G2 (the drain of the pMOS transistor G2a).

The nMOS transistor F2b has a source connected to the fourth potential V4, a drain connected to the second output terminal TOUTN, and a gate connected to the gate of the pMOS transistor F2a and the second differential pair G2 (the drain of the pMOS transistor G2a).

These nMOS transistors F2a and F2b form a current mirror circuit that flows a current, obtained by mirroring the third reception current H3 output from the second differential pair G2, between the fourth potential V4 and the second output terminal TOUTN.

The nMOS transistor F2c has a source connected to the fourth potential V4 and a gate and drain connected to the second differential pair G2 (the drain of the pMOS transistor G2b).

The nMOS transistor F2d has a source connected to the fourth potential V4, a drain connected to the first output terminal TOUTP, and a gate connected to the gate of the nMOS transistor F2c and the second differential pair G2 (the drain of the pMOS transistor G2b).

These nMOS transistors F2c and F2d constitute a current mirror circuit that flows a current, obtained by current mirroring the fourth reception current H4 output from the second differential pair G2, between the fourth potential V4 and the first output terminal TOUTP.

[First Constant Current Source],

As described above, the first constant current source IR1 is connected between the fourth potential V4 and the first differential pair G1, and supplies current to the first differential pair G1. The first constant current source IR1 is, for example, connected between the fourth potential V4 and the first differential pair G1, and is configured using a MOS transistor having a gate to which a preset voltage is applied, thus this first constant current source IR1 may be configured as a current mirror circuit.

[Second Constant Current Source]

As described above, the second constant current source IR2 is connected between the third potential V3 and the second differential pair G2, and supplies current to the second differential pair G2. This second constant current source IR2 is, for example, connected between the third potential V3 and the second differential pair G2, and is configured using a MOS transistor having a gate to which a preset voltage is applied, thus this second constant current source IR2 may be configured as a current mirror circuit.

Next, an example of the operation of the signal transmission device 100 having the above configuration will be described. Here, as described above, FIG. 3 is a waveform diagram for explaining an example of the operation of the signal transmission device shown in FIG. 3.

Here, for example, as shown in FIG. 3, when the first input signal INP and the second input signal INN are differential signals, the controller CON turns off the first switch SW1 and the second switch SW2 by the control signal S10 (until time t1).

After that, at time t1, when the first input signal INP and the second input signal INN become an in-phase signal (LL signal), the controller CON turns on the first and second switches SW1 and SS2, in order to establish electrical continuity between the first transmission terminal TP and the fixed potential (here, the second potential V2) and between the second transmission terminal TN and the fixed potential. After that, the controller CON controls the variable current source portions IT1 and IT2 (the pMOS transistor I1b and the nMOS transistor I2b are turned on) so that the current supplied to the differential circuit portion M increases after a preset delay time (time t1 to time t2) has elapsed (time t2 to time t4).

In this way, when the first transmission signal 2a and the second transmission signal 2b input to the reception buffer RX are in-phase signals (LL signals), the output of the first and second reception currents H1 and H2 is stopped by turning off the first differential pair G1 of the reception buffer RX (the two nMOS transistors G1a and G1b are turned off), and the third and fourth reception currents H3 and H4 are output by turning on the second differential pair G2 (two pMOS transistors G2a and G2b are turned on).

As a result, when the first transmission signal 2a and the second transmission signal 2b input to the reception buffer RX are in-phase signals (LL signals), the first current mirror portion F1 does not flow current between the third potential V3 and the first and second output terminals TOUTP and TOUTN, and the second current mirror portion F2 causes current to flow between the fourth potential V4 and the first and second output terminals TOUTP and TOUTN. That is, when the first transmission signal and the second transmission signal are in-phase signals (here, LL signals), the first and second output signals OUTP and OUTN (in-phase signals (LL signals)) of "Low" level are output from the first and second output terminals TOUTP and TOUTN.

Therefore, when the first input signal INP and the second input signal INN are in-phase signals, the signal transmission device 100 outputs first and second output signals OUTP and OUTN which are in-phase signals (LL signals).

After that, at time t3, when the first input signal INP and the second input signal INN become differential signals, the controller CON turns off the first and second switches SW1 and SW2, so that the state between the first transmission terminal TP and the fixed potential (second potential V2) is cut off, and the state between the second transmission terminal TN and the fixed potential is cut off. After that, the controller CON controls the variable current source portions IT1 and IT2 (turns off pMOS transistor I1b and nMOS transistor I2b) so that the current supplied to the differential circuit portion M decreases after the delay time (time t3 to time t4) has elapsed.

In this way, the transmission buffer TX increases the driving current (current supplied by variable current source portion IT1, IT2) of the differential circuit M at the timing of switching between in-phase transmission and differential transmission, thereby speeding up the switching operation.

Also, when the first transmission signal and the second transmission signal input to the reception buffer RX are differential signals, the first differential pair G1 of the reception buffer RX outputs the first and second reception currents H1 and H2, and the second differential pair G2 outputs the third and fourth reception currents, in response to the first transmission signal and the second transmission signal.

Accordingly, when the first transmission signal and the second transmission signal input to the reception buffer RX are differential signals, the first and second output signals OUTP and OUTN, which are differential signals, are output.

Therefore, when the first input signal INP and the second input signal INN are differential signals, the signal transmission device 100 outputs first and second output signals OUTP and OUTN which are differential signals.

Thereafter, in the signal transmission device 100, similar operations are repeated according to the first and second input signals INP and INN.

As described above, in the signal transmission device 100, in the case of in-phase transmission, the operation of the transmission buffer TX increases the speed of in-phase transmission, since the reception buffer RX can output the output signals OUTP and OUTN at a fixed potential (ground potential), the signal can be received by the inverter, and the subsequent circuit can be simplified.

That is, according to the signal transmission device 100 according to the first embodiment, it is possible to speed up switching between in-phase transmission and differential transmission.

Here, in the above-described first embodiment, an example of the configuration of the signal transmission device has been described. However, the configuration of this signal transmission device is not limited to this. Therefore, in the following second and third embodiments, another example of the configuration of the signal transmission device will be described.

Second Embodiment

In the signal transmission device 100 according to the first embodiment described above, assuming transmission of in-phase "Low" level signals, an example has been described in which the first and second transmission terminals TP and TN are set to fixed potentials and connected to the second potential (ground potential) V2 when the first and second input signals INP and INN are LL signals ("Low" level common-mode signals) as in-phase signals.

However, assuming the case of transmitting an in-phase "High" level signal, the first and second transmission terminals TP and TN may be fixed potentials and connected to the first potential (power supply potential) V1, when the first and second input signals INP and INN are HH signals ("High" level common-mode signals) as in-phase signals.

Figure 4:
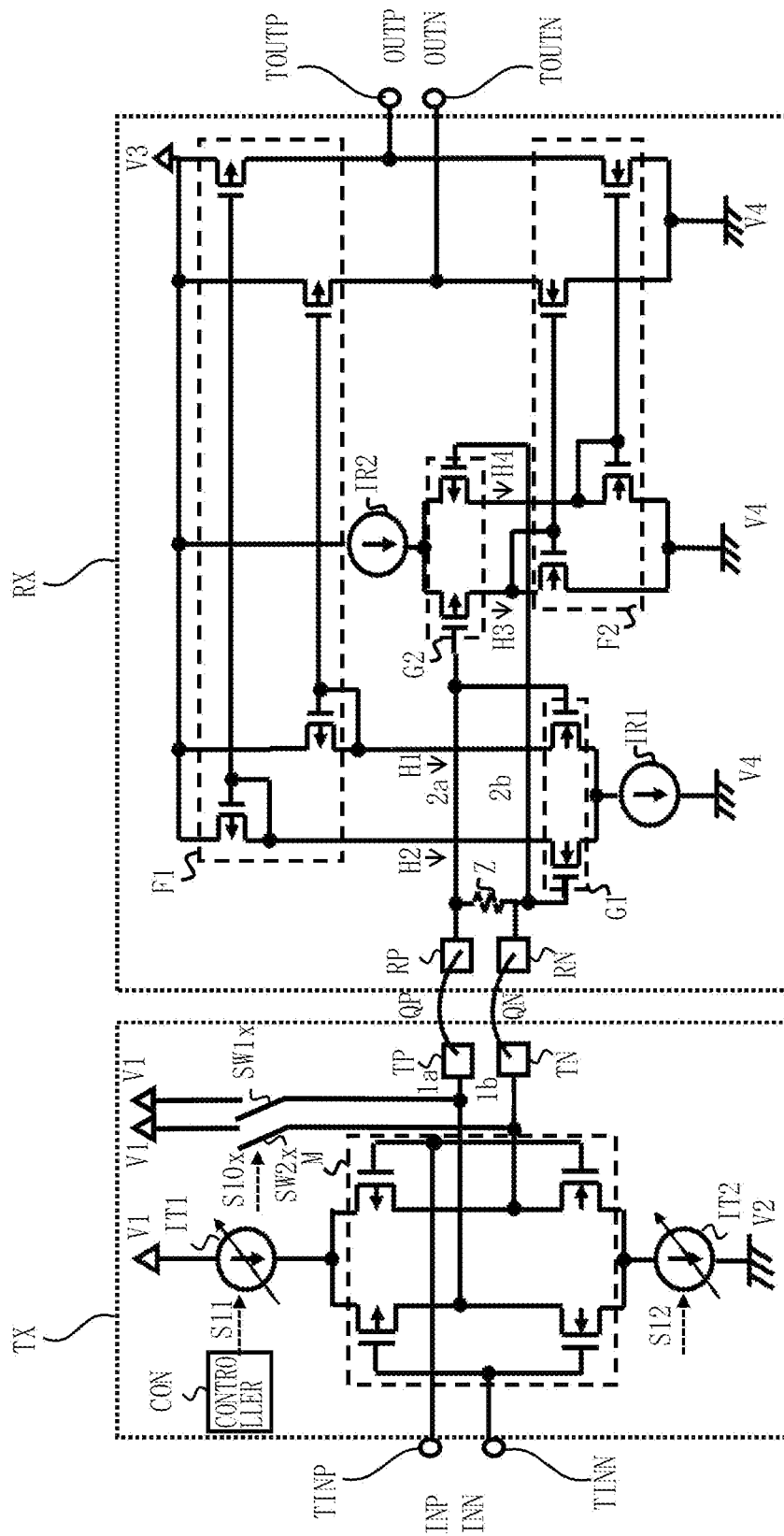
FIG. 4 is a diagram showing an example of the configuration of a signal transmission device according to the second embodiment.

Therefore, in the second embodiment, an example of a signal transmission apparatus assuming a case of transmitting in-phase "High" level signals will be described. FIG. 4 is a diagram showing an example of the configuration of a signal transmission device according to the second embodiment. In the description below, among the components shown in FIG. 4, the description of the same components as those shown in FIG. 1 will be omitted, by assigning the same symbols as those shown in FIG. 1.

In the signal transmission device 200 according to this second embodiment, for example, as shown in FIG. 4, the connection relationship between the switch portions SW1x and SW2x of the transmission buffer TX differs from the connection relationship between the switch portions SW1 and SW2 of the transmission buffer TX according to the first embodiment shown in FIG. 4.

That is, in the signal transmission device 200 according to the second embodiment, the switch portions SW1x and SW2x of the transmission buffer TX are configured to switch between a conductive state and a cut-off state between the first transmission terminal TP and a first potential V1 that is a fixed potential (for example, the power supply potential of the transmission buffer TX), and to switch between a conductive state and a cut-off state between the second transmission terminal TN and the first potential that is a fixed potential.

Then, the controller CON controls the current that the variable current source portions IT1 and IT2 supply to the differential circuit portion M, by the control signals S11 and S12, and controls the operation of the switches SW1x and SW2x by the control signal S10x.

Here, in this second embodiment, for example, when the first input signal INP and the second input signal INN are in-phase (common mode) signals (that is, HH signal: "High" level common-mode signal), the controller CON turns on the switch portions SW1 and SW2, in order to establish continuity between the first transmission terminal TP and the fixed potential (that is, the first potential V1) and between the second transmission terminal TN and the fixed potential.

Accordingly, when the first input signal INP and the second input signal INN are in-phase signals (that is, HH signals), the common mode voltage can be rapidly raised.

On the other hand, when the first input signal INP and the second input signal INN are differential signals, the controller CON turns off the switch portions SW1x and SW2x. In order to cut off between the first transmission terminal TP and the fixed potential and cut off between the second transmission terminal TN and the fixed potential.

Other configurations and operations of the signal transmission device 200 of the second embodiment are the same as those of the signal transmission device 100 of the first embodiment.

That is, according to the signal transmission device according to the second embodiment, it is possible to speed up switching between in-phase transmission and differential transmission.

Third Embodiment

In the signal transmission devices 100 and 200 according to the first and second embodiments described above, assuming that only one of the in-phase "Low" level signal or "High" level signal is transmitted, an example has been described in which the first and second transmission terminals TP and TN are set to fixed potentials and connected to the second potential (ground potential) V2 or the first potential (power supply potential), when the first and second input signals INP and INN are LL signals ("Low" level or "High" level in-phase signals) as in-phase signals.

However, assuming the case of transmitting in-phase "Low" level signals and "High" level signals, when the first and second input signals INP and INN are LL signals ("Low" level common-mode signals) as in-phase signals, the first and second transmission terminals TP and TN may be connected to the second potential (ground potential) V2 as a fixed potential, and furthermore, when the first and second input signals INP and INN are HH signals ("High" level in-phase signals) as in-phase signals, the first and second transmission terminals TP and TN may be connected to a first potential (fixed potential) V1 as a fixed potential.

Figure 5:
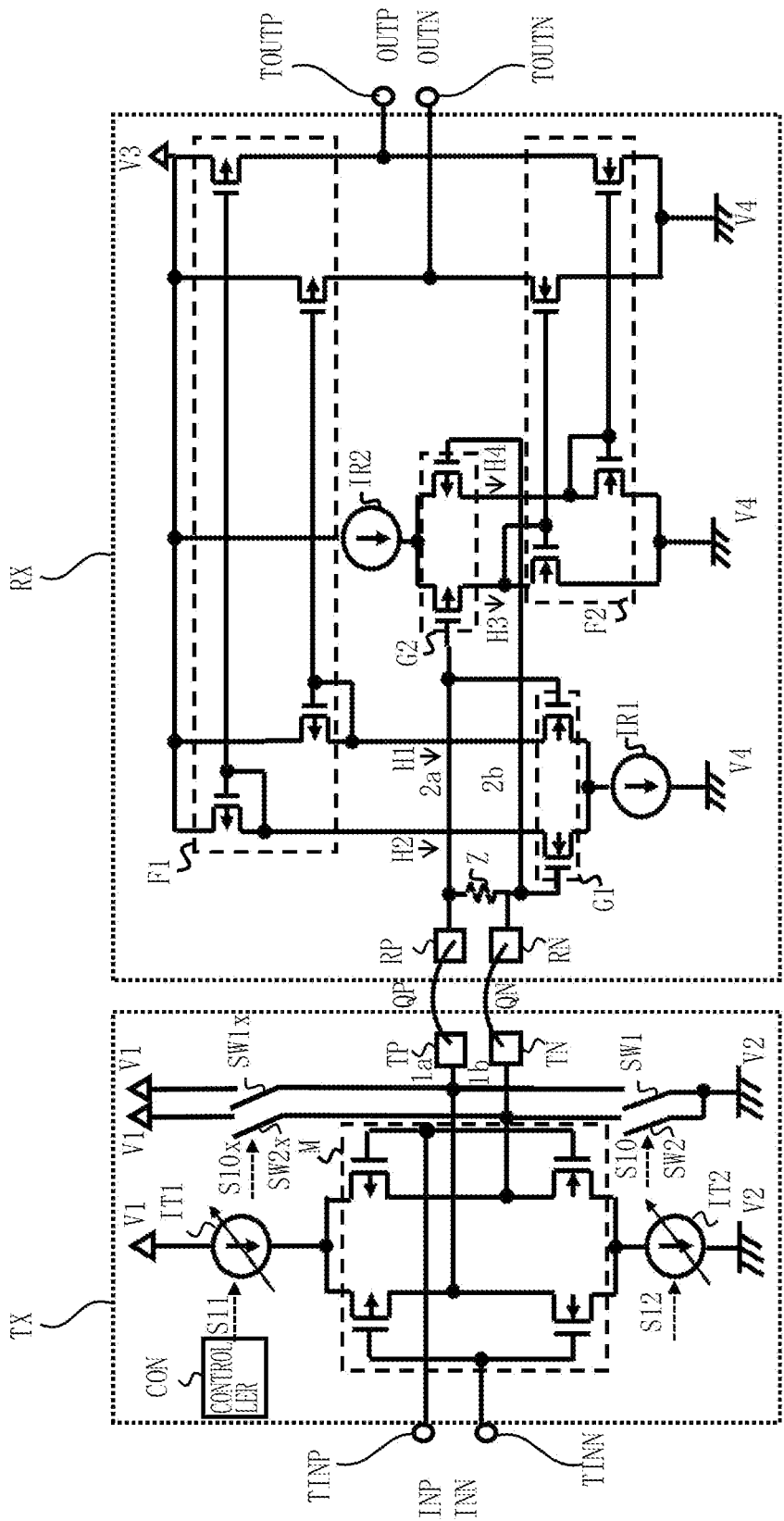
FIG. 5 is a diagram showing an example of the configuration of a signal transmission device according to the third embodiment.

Therefore, in the third embodiment, an example of a signal transmission apparatus assuming a case of transmitting in-phase "High" level signals will be described. FIG. 5 is a diagram showing an example of the configuration of a signal transmission device according to the third embodiment. In the following description, among the components shown in FIG. 5, the description of the same components as those shown in FIGS. 1 and 4 will be omitted, by assigning the same reference numerals as those shown in FIGS. 1 and 4.

For example, as shown in FIG. 5, in the signal transmission device 300 according to this third embodiment, the connection relationship of the switch portions SW1, SW2, SW1x, and SW2x of the transmission buffer TX corresponds to a configuration in which the switch portions SW1 and SW2 of the transmission buffer TX according to the first embodiment shown in FIG. 1 and the switch portions SW1x and SW2x of the transmission buffer TX according to the second embodiment shown in FIG. 4 are combined.

In the signal transmission device 300 according to this third embodiment, the controller CON controls the current supplied by the variable current source portions IT1 and IT2 to the differential circuit portion M using control signals S11 and S12, and controls the operation of the switches SW1, SW2, SW1x, and SW2x with control signals S10 and S10x, a specific control operation is the same as in the first and second embodiments.

Other configurations and operations of the signal transmission device 300 of the third embodiment are the same as those of the signal transmission devices 100 and 200 of the first and second embodiments.

That is, according to the signal transmission device according to the third embodiment, it is possible to speed up switching between in-phase transmission and differential transmission.

Modified Example

Here, an example of a more specific configuration of the variable current source portion of the transmission buffer of the signal transmission device according to the embodiment shown in FIG. 2 will be described as a modified example.

Figure 6:
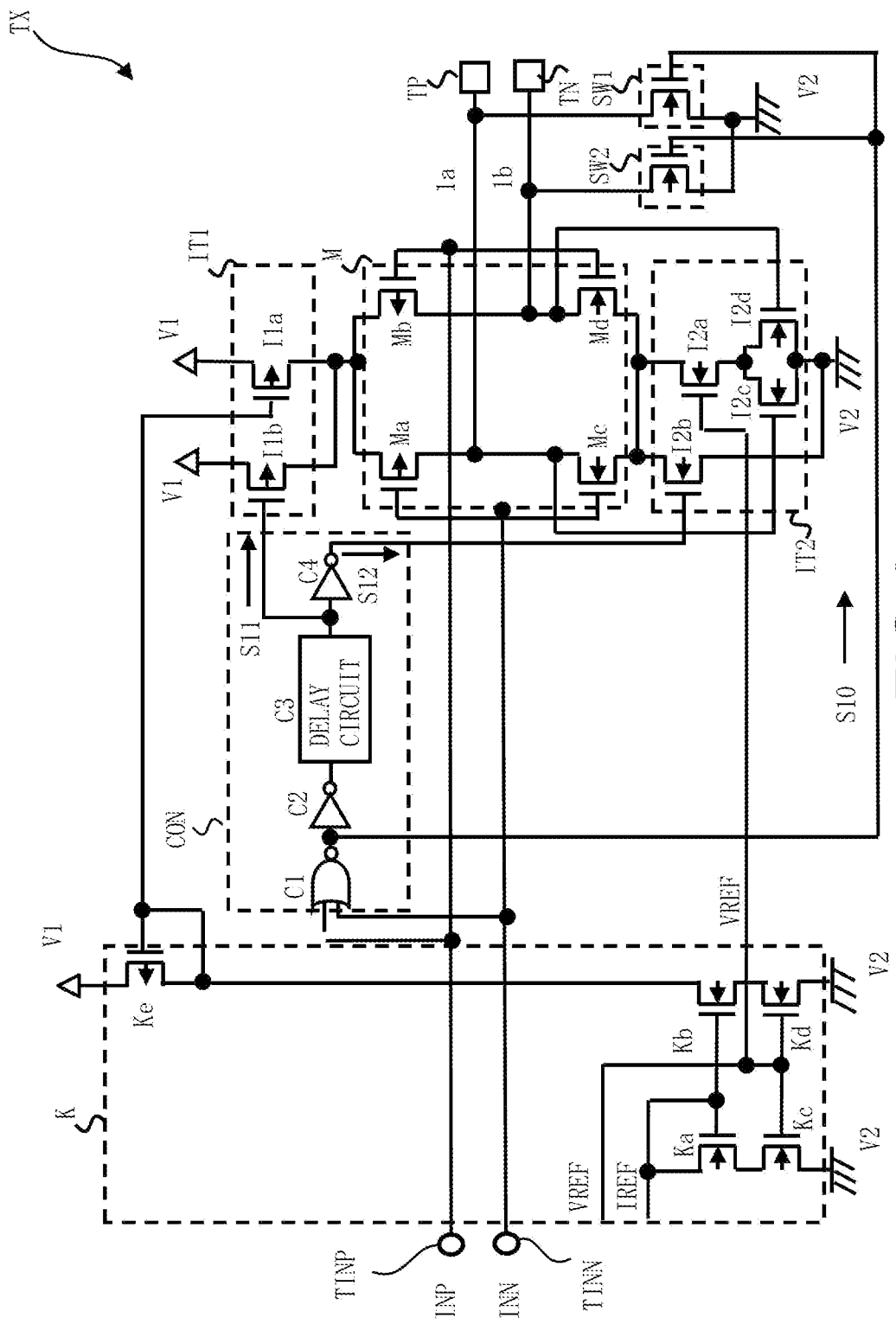
FIG. 6 is a diagram showing an example of the configuration of the transmission buffer of the signal transmission device according to the modification.

FIG. 6 is a diagram showing an example of the configuration of the transmission buffer of the signal transmission device according to the modification. In the following description, among the components shown in FIG. 6, the description of the same components as those shown in FIG. 2 may be omitted, by assigning the same symbols as those shown in FIG. 2.

For example, as shown in FIG. 6, the transmission buffer TX of the signal transmission device according to this modification may include a current mirror portion K that defines the currents of the constant current sources I1a and I2a of the variable current source portions IT1 and IT2. In this case, for example, as shown in FIG. 6, the constant current source I1a is a pMOS transistor whose source is connected to the first potential V1 and whose drain is connected to the differential circuit M, the constant current source I2a is an nMOS transistor whose source is connected to the second potential V2 and whose drain is connected to the differential circuit M.

Furthermore, for example, as shown in FIG. 6, the current mirror portion K includes: an nMOS transistor Ka having a drain and a gate to which a reference current IREF is input; an nMOS transistor Kb having a gate connected to the gate of the nMOS transistor Ka; an nMOS transistor Kc connected between the source of the nMOS transistor Ka and a second potential V2, having a gate connected to the gate of the nMOS transistor I2a and to which a reference voltage VREF is applied, for controlling the common mode voltage; an nMOS transistor Kd connected between the source of the nMOS transistor Kb and the second potential V2 and having a gate connected to the gate of the nMOS transistor Kc for controlling the common mode voltage; and a pMOS transistor Ke having a source connected to a first potential V1 and having a drain and a gate connected to the drain of the nMOS transistor Kb, the gate being connected to the gate of the pMOS transistor I1a.

A predetermined mirror current flows due to the reference voltage VREF and the reference current IREF input to the current mirror portion K having such a configuration, this sets the common mode voltage, by defining the currents of the constant current source I1a, which is a pMOS transistor, and the constant current source I2a, which is an nMOS transistor.

The other configuration and operation of the transmission buffer TX of the signal transmission device according to this modification are the same as the configuration and operation of the transmission buffer according to the embodiment shown in FIG. 2.

Fourth Embodiment

In the fourth embodiment, an example of the configuration of a signal transmission system to which the signal transmission devices according to the first to third embodiments are applied will be described.

Figure 7:
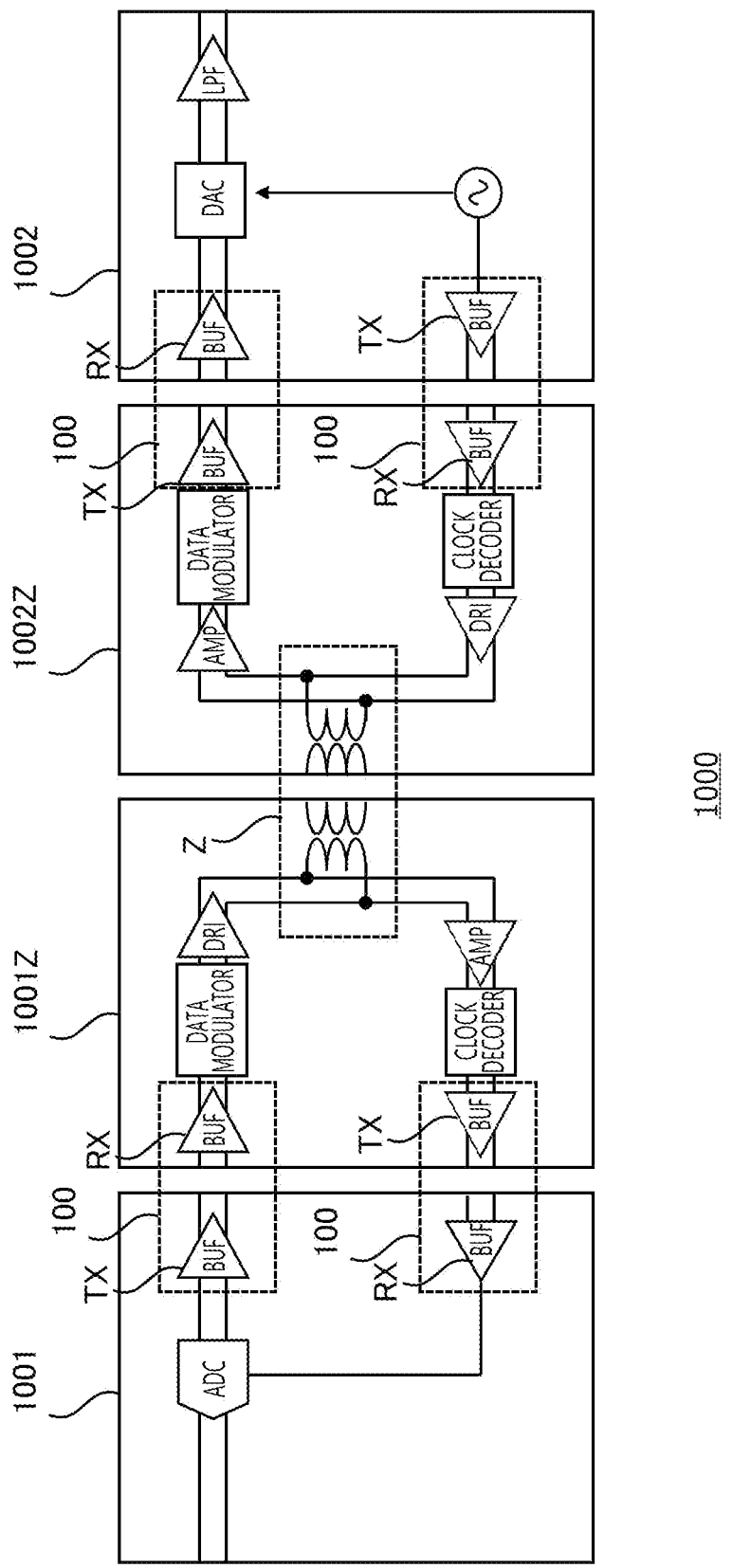
FIG. 7 is a diagram showing an example of the configuration of a signal transmission system to which the signal transmission device according to each embodiment is applied.

FIG. 7 is a diagram showing an example of the configuration of a signal transmission system to which the signal transmission device is applied. It is noted that the example of the signal transmission system 1000 shown in FIG. 7 shows a configuration to which the signal transmission apparatus 100 according to the first embodiment is applied. However, the same applies to the signal transmission apparatuses 200 and 300 according to the second and third embodiments.

As shown in FIG. 7, the signal transmission system 1000 transmits an input signal and outputs output signals OUTP and OUTN.

For example, as shown in FIG. 7, this signal transmission system 1000 comprises: a signal primary circuit (semiconductor chip) 1001 to which input signals INP and INN are input; an insulated primary circuit (semiconductor chip) 1001Z that transmits signals to and from the signal primary circuit 1001; a signal secondary circuit (semiconductor chip) 1002 that outputs output signals OUTP and OUTN; and, an insulating secondary circuit (semiconductor chip) 1002Z that transmits signals to and from the signal secondary circuit 1002.

Then, as shown in FIG. 7, a signal is transmitted between the insulated primary circuit 1001Z and the insulated secondary circuit 1002Z, by the magnetic coupling type isolation element Z having an electrically isolated insulating transformer structure. In particular, the signal transmission device 100 according to the first embodiment is applied to the signal transmission between the semiconductor chips of the signal primary circuit 1001 and the insulation primary circuit 1001Z, and the signal transmission device 100 according to the first embodiment is applied to transmission of signals between the semiconductor chips of the signal secondary circuit 1002 and the insulation secondary circuit 1002Z.

It is noted that, as described above, the signal transmission devices 200 and 300 according to the second and third embodiments may also be applied to the signal transmission system 1000 in the same manner.

Here, as described above, since the first to third signal transmission devices 100, 200, and 300 can speed up switching between in-phase transmission and differential transmission, also in the signal transmission system 1000 to which these signal transmission devices are applied, it is possible to speed up switching between in-phase transmission and differential transmission.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A signal transmission device having a transmission buffer and a reception buffer,
    wherein the transmission buffer comprises:
        a differential circuit portion that is connected between a first potential and a second potential, and that outputs a first transmission signal to a first transmission terminal and a second transmission signal to a second transmission terminal, depending on a first input signal input via a first input terminal and a second input signal input via a second input terminal;

a variable current source portion that supplies current to the differential circuit portion;

a switch portion that switches between a conductive state and a disconnected state between the first transmission terminal and a fixed potential and between the second transmission terminal and the fixed potential; and a controller that controls the current supplied by the variable current source portion to the differential circuit portion, and that controls the operation of the switch portion, and wherein the reception buffer comprises:

a first differential pair of a first conductivity type that is connected between a third potential and a fourth potential, that outputs a first received current in response to the first transmission signal input via a first received terminal, and that outputs a second received current in response to the second transmission signal input via a second received terminal;

a second differential pair of a second conductivity type that is connected between the third potential and the fourth potential, that outputs a third received current in response to the first transmission signal, and that outputs a fourth received current in response to the second transmission signal;

a first current mirror portion that flows a first mirror current obtained by current mirroring the first received current, between the third potential and a second output terminal, and that flows a second mirror current obtained by current mirroring the second received current, between the third potential and a first output terminal; and a second current mirror portion that flows a third mirror current obtained by current mirroring the third received current, between the second output terminal and the fourth potential, and that flows a fourth mirror current obtained by current mirroring the fourth received current, between the first output terminal and the fourth potential.

2. The signal transmission device according to claim 1, wherein, when the first input signal and the second input signal are in-phase signals, the controller controls the switch portion so that an electrical path between the first transmission terminal and the fixed potential and an electrical path between the second transmission terminal and the fixed potential are in the conductive state, and wherein, when the first input signal and the second input signal are differential signals, the controller controls the switch portion so that the electrical path between the first transmission terminal and the fixed potential and the electrical path between the second transmission terminal and the fixed potential are in the disconnected state.

3. The signal transmission device according to claim 2, wherein, when the first input signal and the second input signal are in-phase signals, the controller controls the variable current source portion so that the current supplied to the differential circuit portion increases, and wherein, when the first input signal and the second input signal are differential signals, the controller controls the variable current source portion so that the current supplied to the differential circuit portion decreases.

4. The signal transmission device according to claim 3, wherein, when the first input signal and the second input signal are in-phase signals, the controller turns on the switch portion so that an electrical path between the first transmission terminal and the fixed potential and an electrical path between the second transmission terminal and the fixed potential are in the conductive state, and after that, the controller controls the variable current source portion so that the current supplied to the differential circuit portion increases after a preset delay time has elapsed, and wherein, when the first input signal and the second input signal are differential signals, the controller turns off the switch portion so that the electrical path between the first transmission terminal and the fixed potential and the electrical path between the second transmission terminal and the fixed potential are in the disconnected state, and after that, the controller controls the variable current source portion so that the current supplied to the differential circuit portion decreases after the delay time has elapsed.

5. The signal transmission device according to claim 1, wherein the fixed potential is the first potential.

6. The signal transmission device according to claim 1, wherein the fixed potential is the second potential.

7. The signal transmission device according to claim 2, wherein the fixed potential is the first potential.

8. The signal transmission device according to claim 2, wherein the fixed potential is the second potential.

9. The signal transmission device according to claim 1, wherein the reception buffer further comprises:

a first constant current source connected between the fourth potential and the first differential pair to supply a first constant current to the first differential pair; and a second constant current source connected between the third potential and the second differential pair to supply a second constant current to the second differential pair.

10. The signal transmission device according to claim 2, wherein the reception buffer further comprises:

a first constant current source connected between the fourth potential and the first differential pair to supply a first constant current to the first differential pair; and a second constant current source connected between the third potential and the second differential pair to supply a second constant current to the second differential pair.

* * * * *